United States Patent [19]

Matsumoto et al.

[11] Patent Number: 4,689,646

[45] Date of Patent: Aug. 25, 1987

[54] DEPLETION MODE TWO-DIMENSIONAL ELECTRON GAS FIELD EFFECT TRANSISTOR AND THE METHOD FOR MANUFACTURING THE SAME

[75] Inventors: Yoshishige Matsumoto; Naotaka Iwata, both of Tokyo, Japan

[73] Assignee: NEC Corporation, Tokyo, Japan

[21] Appl. No.: 741,597

[22] Filed: Jun. 5, 1985

[30] Foreign Application Priority Data

Jun. 5, 1984 [JP] Japan .................... 59-114868

[51] Int. Cl.$^4$ ............................................. H01L 29/80
[52] U.S. Cl. ............................................ 357/22; 357/4
[58] Field of Search ............ 357/22 A, 22 MD, 45 L, 357/23.12, 49, 15, 16

[56] References Cited

U.S. PATENT DOCUMENTS

| 4,194,935 | 3/1980 | Dingle et al. ............... 357/22 A X |
| 4,424,525 | 1/1984 | Mimura ...................... 357/22 A X |
| 4,511,408 | 4/1985 | Holonyak, Jr. ............... 357/4 X |

FOREIGN PATENT DOCUMENTS 60-28273  2/1985  Japan ........................ 357/22 MD Primary Examiner—Martin H. Edlow
Assistant Examiner—Sara W. Crane
Attorney, Agent, or Firm—Burns, Doane, Swecker & Mathis

[57] ABSTRACT

The depletion mode two-dimensional electron gas field effect transistor comprises a substantially pure semiconductor layer, an impurity doped super lattice semiconductor layer formed on the pure semiconductor layer, the energy band gaps and the electron affinities of the pure semiconductor layer and the super lattice semiconductor layer being selected to produce the two-dimensional electron gas at the surface of the pure semiconductor layer when no bias is applied to the super lattice semiconductor layer, source and drain regions formed separatedly in the super lattice semiconductor layer to reach the pure semiconductor layer, a gate electrode formed on the super lattice semiconductor layer between the source and drain regions, and large energy band gap regions formed at side portions of the gate electrode which do not face the source and drain regions, the large energy band gap regions having an energy band gap larger than the super lattice semiconductor layer and being formed by local annealing to convert the super lattice semiconductor to a mixed semiconductor.

13 Claims, 3 Drawing Figures

DEPLETION MODE TWO-DIMENSIONAL ELECTRON GAS FIELD EFFECT TRANSISTOR AND THE METHOD FOR MANUFACTURING THE SAME

BACKGROUND OF THE INVENTION

1. Field of the Invention

This invention relates to a high speed field effect transistor using high mobility of two-dimensional electron gas, more particularly to a depletion mode two-dimensional electron gas field effect transistor and the method for manufacturing the same.

2. Description of the Prior Art

The two-dimensional electron gas field effect transistor (hereinafter, referred to as 2-DEG.FET) attracts many engineer's attentions due to its high speed operability. The 2-DEG.FET uses high mobility of two-dimensional electron gas, that is, electrons confined in a potential well formed on the side of GaAs at the boundary between GaAs and impurity-doped AlGaAs. The electrons are supplied from the AlGaAs to the potential well to form the electron gas. Since such electron gas exhibits a property controlled by the scattering probability of two-dimensional electron gas, the electron gas has a very high mobility.

The 2-DEG.FET still has some drawbacks. One of them is a leakage current flowing between source and drain regions when the channel under the gate electrode is pinched off. The occurrence of such leakage current will now be explained.

The 2-DEG.FET is formed on a semi-insulator GaAs substrate on which a pure or $N^-$-type GaAs layer and an impurity-doped N-type super lattice layer of GaAs and AlAs are consecutively formed. Source and drain regions are formed by alloying Au-Ge alloy from the surface of the super lattice layer. A gate electrode is formed on the super lattice layer between the source and drain regions by evaporating W-Si.

Under the side portions of the gate electrode, depletion layers cannot extend to fully pinch off the potential well in the surface region of the GaAs layer. Through the unpinched potential well portion, the leakage current flows between the source and drain regions. Therefore, the depletion mode 2-DEG.FET cannot be driven into a condition that the current flowing between source and drain regions becomes zero. This phenomenon results in lowering the resistance between source and drain regions, causing a deterioration of high speed operation.

SUMMARY OF THE INVENTION

The primary object of the present invention is to provide a depletion mode 2-DEG.FET which can be driven into a condition that the current flowing between source and drain regions becomes zero.

Another object of the present invention is to provide a depletion mode 2-DEG.FET having a superior high speed operation.

According to the present invention, there is provided a 2-DEG.FET comprising a heterojunction of a first semiconductor layer and a second semiconductor layer, the first semiconductor layer being a substantially pure semiconductor having a first width of energy band gap and the second semiconductor layer being an impuritydoped semiconductor having a second width of energy band gap larger than the first width, source and drain regions formed from the surface of the second semiconductor layer so as to reach the interface between the first and second semiconductor layers, a gate electrode formed in contact with the surface of the second semiconductor layer between the source and drain regions, two dimensional electron gas existing in the first semiconductor layer near the boundary between the first and second semiconductor layers when the gate electrode is not biased, and large energy band gap regions formed in the second semiconductor layer at the both side regions of the gate electrode in the gate width direction, the large energy band gap regions having a third width of energy band gap larger than the second width. The third width is preferably selected as a value larger than the second width by at least three times the temperature energy at operating condition. "Temperature energy" is defined as the thermal energy obtained by multiplying Boltzmann's constant by the absolute temperature. The temperature energy is 26 meV at room temperature and 6 meV at 77° K. which is a liquid nitrogen temperature.

The method for manufacturing the 2-DEG.FET comprises the steps of forming a second semiconductor layer of a super lattice semiconductor on a first semiconductor layer of a substantially pure semiconductor, the effective energy band gap of the super lattice semiconductor being larger than the energy band gap of the substantially pure semiconductor, forming a source region and a drain region extending from the surface of the second semiconductor layer to the interface between the first and second semiconductor layers, forming a gate electrode on the surface of the second semiconductor layer between the source and drain regions, and forming large energy band gap regions at both side regions of the gate electrode which do not face the source and drain regions by local annealing to convert the super lattice semiconductor to a mixed semiconductor. The local annealing may be performed by a laser beam, an electron beam, an ion beam, an neutralized atom beam or a neutron beam.

According to the 2-DEG.FET of the present invention, the flow of the two-dimensional electron gas through the sides of the gate electrode which do not face the source and drain regions, is blocked by the large energy band gap regions. Thus, the current flowing between the source and drain regions may be driven to a very small value. The operating resistance between the source and drain regions becomes high to improve high speed operation. The large energy band gap regions are easily formed by the local annealing which converts the super lattice semiconductor into the mixed semiconductor. The additional process for forming the large energy band gap regions is very easy and simple.

BRIEF DESCRIPTION OF THE DRAWINGS

The above and further objects, features and advantages of the present invention will become apparent from following detailed description taken in conjunction with the accompanying drawings, wherein.

Figure 1:
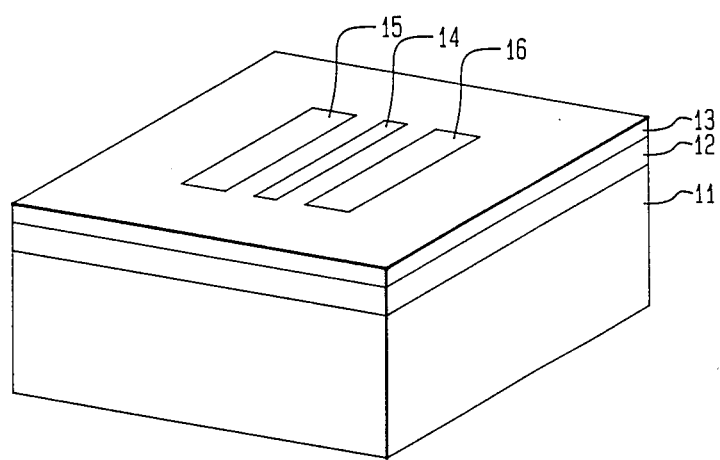
FIG. 1 is a perspective view of the depletion mode 2-DEG.FET in the prior art.

The depletion mode 2-DEG.FET will be explained with reference to FIG. 1. A high purity $N^-$-type GaAs layer 12 having an electron density of $10^{15}$ cm$^{-3}$ is grown on a semi-insulating GaAs substrate 11. On the $N^-$-type GaAs layer 12, a GaAs/AlAs super lattice layer 13 having an effective electron concentration of about $2\times10^{18}$ cm$^{-3}$ and having a thickness of about 1,500 Å by alternatively piling a plurality of GaAs layers having a thickness of 20 Å and a plurality of AlAs layers having a thickness of about 13 Å. In the super lattice layer 13, while the GaAs layers are doped with silicon as an impurity, the AlAs layers are made of pure AlAs. The two-dimensional electron gas is produced at the surface portion of the GaAs layer 12 when no bias is applied to the super lattice layer 13.

Source and drain regions 15 and 16 are formed by alloying an alloy of Au-Ge with the super lattice layer 13 to reach the interface between the GaAs layer 12 and the super lattice layer 13. A gate electrode 14 of W-Si having a width of 1 μm is formed on the super lattice layer 13 between the source and drain regions 15 and 16. The length of the gate electrode 14 is designed such that the depletion layer produced by a gate bias voltage extends to the side edges of the super lattice layer 13. The depletion mode is performed in such a way that the depletion layer produced by the voltage at the gate electrode pinches off the potential well for the two-dimensional electron gas, that is, the resistance between the source and drain regions becomes infinite by increasing the gate voltage.

In the above-explained depletion mode operation, under the side portion far from the sides of the gate electrode 14 which do not face the source and drain regions 15 and 16, the depletion layer produced by the gate voltage cannot completely pinch the potential well for the two-dimensional electron gas, causing a leakage current between the source and drain regions 15 and 16. This unpinched potential well decreases the operating resistance between the source and drain regions 15 and 16 and deteriorates the high speed operability.

DETAILED DESCRIPTION OF THE PREFERRED EMBODIMENTS

The basic structure of the depletion mode 2-DEG.-FET according to the first preferred embodiment of the present invention is similar to the depletion mode 2-DEG.FET in the prior art shown in FIG. 1. A pure or $N^-$-type GaAs layer 12 having an electron density of $10^{15}$ cm$^{-3}$ is grown on a semi-insulating GaAs substrate 11. On the GaAs layer 12, a super lattice layer 13 having an effective electron density of about $2\times10^{18}$ cm$^{-3}$ is formed with a thickness of 1,500 Å. The super lattice layer is a multi-layer structure of GaAs layers having a thickness of 20 Å and AlAs layers having a thickness of 13 Å. In the multi-layer structure, GaAs layers are doped with Si as impurity but AlAs layers are pure AlAs. The two-dimensional electron gas is produced at the surface of the GaAs layer 12 for the depletion mode operation when no bias is applied to the super lattice layer 13.

Any other semiconductors may be replaced with the GaAs layer 12 and the super lattice layer 13. However, such replaceable semiconductors should have the following energy band relationships to produce the two-dimensional electron gas. That is, the semiconductor for the GaAs layer 12 should have an electron affinity larger than the semiconductor for the super lattice layer 13. The energy band gap of the semiconductor for the super lattice layer 13 should be larger than the semiconductor for the GaAs.

Source and drain regions 15 and 16 are formed by alloying an alloy of Au-Ge with the super lattice layer 13 to reach the interface between the GaAs layer 12 and the super lattice layer 13. A gate electrode 14 of W-Si having a width of 1 μm is evaporated on the super lattice layer 13. At the side portions of the gate electrode 14 which do not face the source and drain regions 15 and 16, large energy gap regions 21 are formed having an energy gap larger than the semiconductor of the super lattice layer 13. The large energy gap regions 21 are positioned between the gate electrode 14 and the edge of the super lattice layer 13 and are formed by locally annealing the super lattice layer 13 by a laser beam to convert the super lattice to a mixed semiconductor of GaAlAs. An example of the laser annealing uses Ar laser of 4 watts and performs the annealing for a time duration from several to 10 seconds. As a result of the laser annealing, the band gap is increased from about 1.77 eV to about 1.91 eV (estimated from the peak energy of photo-luminescence).

The energy band gap of the large band gap regions 21 should be larger than the semiconductor for the super lattice layer 13, and more preferably larger than the semiconductor for the super lattice layer 13 by more than three times the temperature energy at the operating temperature. The temperature energy is 26 meV at a room temperature and 6 meV at a liquid nitrogen temperature.

The local annealing may be performed by other beams such as an electron beam, an ion beam of He, H, O and so on, a beam of neutral particles such as atoms (after ionization, atoms are neutralized by being applied with electrons) and neutrals. An overlapping of the gate electrode 14 and the large energy band gap regions 21 is allowed and does not spoil the effect of the present invention. The local annealing may be performed through a film of $SiO_2$ or SiN formed on the super lattice layer 13 to protect the surface of the super lattice layer 13 from contamination. The local annealing may be performed after or before the formation of the gate electrode 14.

By the local annealing, Si impurities are introduced into the GaAs layer 12 to lower the generation of two-dimensional electron gas at the surface of GaAs layer 12 at which the mobility of electrons is made very small. As a result, the leakage current between the source and drain regions flowing under the large energy band gap regions 21 becomes very small. In a case where the gate width of the gate electrode 14 between the source and drain electrodes 15 and 16 is 10 μm, the leakage current smaller than $10^{-15}$ A is observed. The reproducibility of such small leakage current is very good. The small leakage current causes a high operating resistance between the source and drain regions 15 and 16. A high frequency pulse operation of several tens of seconds is achieved.

Figure 2:
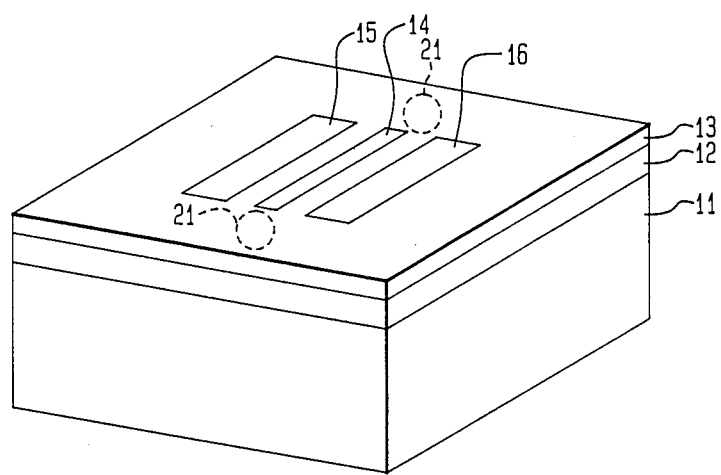
FIG. 2 is a perspective view of the depletion mode 2-DEG.FET according to a first embodiment of the present invention.
Figure 3:
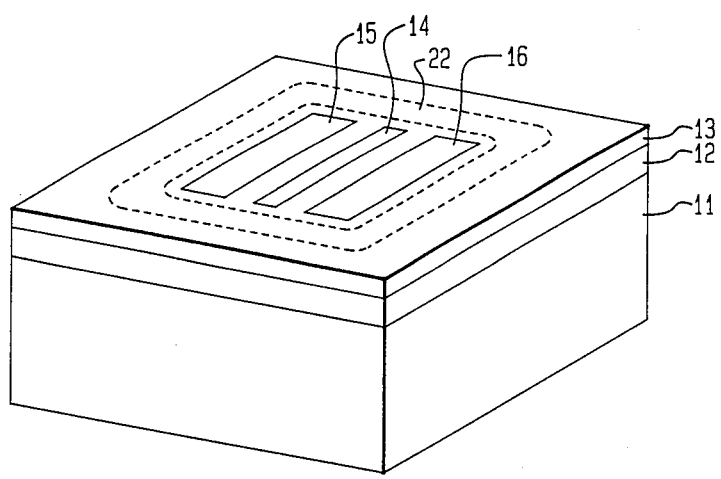
FIG. 3 is a perspective view of the depletion mode 2-DEG.FET according to a second embodiment of the present invention.

The second preferred embodiment of the present invention is shown in FIG. 3 and has a similar structure except for the large energy band gap ring 22. The large energy band gap ring 22 is formed so as to surround all the gate electrode 14, the source region 15 and the drain region 16. The leakage current between the source and drain regions 15 and 16 is made very small, similarly to the first preferred embodiment explained with reference to FIG. 2. Moreover, all the leakage current flowing from the source and drain regions are blocked by the large energy band gap ring 22. This effect allows the depletion mode 2-DEG.FET of the second preferred embodiment to be formed on the same semiconductor chip with other circuit element as a form of an integrated circuit.

Although some preferred embodiments were explained above, the present invention is not limited to them. For example, the present invention may be applied to an impurity doped super lattice semiconductor of impurity doped InAs layers and substantially pure AlAs layers on a substantially pure InGaAs with a semi-insulating InP substrate.

What is claimed is:

1. A depletion mode field effect transistor comprising a first semiconductor layer of a substantially pure semiconductor having first width of energy band gap and a first electron affinity, a second semiconductor layer formed on said first semiconductor layer and having a second width of energy band gap and a second electron affinity, said second semiconductor layer being doped with impurities, said first and second widths of energy band gap and said first and second electron affinities having a relationship for producing a two-dimensional electron gas at the surface of said first semiconductor layer when no bias is applied to the second semiconductor layer, source and drain region formed in said second semiconductor layer to reach said first semiconductor layer, a gate electrode formed on said second semiconductor layer between said source and drain regions, large energy band gap portions formed in said second semiconductor layer at side portions of said gate electrode which do not face said source and drain regions, said large energy band gap portions having an energy band gap wider than said second semiconductor layer, and impurity doped portions located below said large energy band portions, said impurity doped portion being formed by introducing said impurities from said second semiconductor layer into a surface of said first semiconductor layer contacting said second semiconductor layer.

2. A depletion mode field effect transistor as claimed in claim 1, wherein said first width of energy band gap is smaller than said second width of energy band gap, said first electron affinity being larger than said second electron affinity.

3. A depletion mode field effect transistor as claimed in claim 1, wherein said large energy band gap portions have an energy band gap larger than said second semiconductor layer by more than three times the thermal energy at operating temperture, said thermal energy having a value obtained by multiplying Boltzmann's constant by an absolute temperature of said operating temperature.

4. A depletion mode field effect transistor as claimed in claim 3, wherein said second semiconductor layer is a supper lattice semiconductor acting as a single semiconductor layer.

5. A depletion mode field effect transistor as claimed in claim 4, wherein said large energy band gap portions are made of a mixed semiconductor converted from said super lattice semiconductor acting as a single semiconductor layer.

6. A depletion field effect transistor as claimed in claim 5, wherein said large energy band gap portions are continuous to surround all of said source and drain regions and said gate electrode.

7. A depletion mode field effect transistor as claimed in claim 5, wherein said field effect transistor further comprises a semi-insulating substrate on which said first semiconductor layer is formed.

8. A depletion mode field effect transistor as claimed in claim 7, wherein said semi-insulating substrate, said first semiconductor layer and said second semiconductor layer are respectively made of a semi-insulating GaAs, a substantially pure GaAs and a super lattice semiconductor composed of impurity doped GaAs layers and substantially pure AlAs layers.

9. A depletion mode field effect transistor as claimed in claim 7, wherein said semi-insulating substrate, said first semiconductor layer and said second semiconductor layer are respectively made of a semi-insulating InP, a substantially pure InGaAs and a super lattice semiconductor composed of impurity doped InAs layers and substantially pure AlAs layers.

10. The transistor of claim 1 wherein said gate electrode forms Schottky junction with said second semiconductor layer.

11. A depletion mode field effect transistor comprising a semi-insulating GaAs substrate, a substantially pure GaAs layer formed on said GaAs substrate, a superlattice semiconductor layer formed on said GaAs layer, said superlattice semiconductor layer being composed of impurity-doped GaAs layers and substantially pure AlAs layers and acting as a single semiconductor layer, source and drain regions formed separately in said super lattice semiconductor layer to reach said GaAs layer, a gate electrode formed on said superlattice semiconductor layer between said source and drain regions, mixed semiconductor regions formed in said super lattice semiconductor layer at side portions of said gate electrode which do not face said source and drain regions, said mixed semiconductor regions being converted from said superlattice semiconductor layer by annealing, and impurity doped portions formed in a surface region of said GaAs layer contacting said superlattice semiconductor layer, and being doped with said impurities in said impurity-doped GaAs layers by said annealing.

12. A depletion mode field effect transistor as claimed in claim 11, wherein said mixed semiconductor regions are continuous to surround all of said source and drain regions and said gate electrode.

13. The transistor of claim 11 wherein said gate electrode forms a Schottky junction with said superlattice semiconductor layer.

* * * * *